United States Patent
Mann et al.

(10) Patent No.: US 7,177,076 B2
(45) Date of Patent: *Feb. 13, 2007

(54) 8-MIRROR MICROLITHOGRAPHY PROJECTION OBJECTIVE

(75) Inventors: Hans-Jürgen Mann, Oberkochen (DE); Wilhelm Ulrich, Aalen-Dewangen (DE); Günther Seitz, Spiegelberg (DE)

(73) Assignee: Carl Zeiss SMT AG, Oberkochen (DE)

( * ) Notice: Subject to any disclaimer, the term of this patent is extended or adjusted under 35 U.S.C. 154(b) by 104 days.

This patent is subject to a terminal disclaimer.

(21) Appl. No.: 10/418,515

(22) Filed: Apr. 18, 2003

(65) Prior Publication Data

US 2004/0012866 A1    Jan. 22, 2004

Related U.S. Application Data

(63) Continuation of application No. PCT/EP01/12110, filed on Oct. 19, 2001.

(60) Provisional application No. 60/255,216, filed on Dec. 13, 2000.

(30) Foreign Application Priority Data

Oct. 20, 2000 (DE) ................... 100 52 289

(51) Int. Cl.
*G02B 17/00* (2006.01)
*G21K 5/00* (2006.01)
*G03B 27/72* (2006.01)

(52) U.S. Cl. ............... 359/365; 359/366; 359/857; 355/71; 378/34

(58) Field of Classification Search ........ 359/365–367, 359/725–732, 851–872, 350–361, 707; 355/52–79; 378/31–75, 85
See application file for complete search history.

(56) References Cited

U.S. PATENT DOCUMENTS

| | | | |
|---|---|---|---|
| 5,153,898 A | 10/1992 | Suzuki et al. | 378/34 |
| 5,315,629 A | 5/1994 | Jewell et al. | 378/34 |
| 5,686,728 A | 11/1997 | Shafer | 250/492.2 |
| 5,815,310 A | 9/1998 | Williamson | 359/365 |
| 6,033,079 A | 3/2000 | Hudyma | 359/857 |
| 6,353,470 B1 * | 3/2002 | Dinger | 355/71 |
| 6,556,648 B1 * | 4/2003 | Bal et al. | 378/34 |
| 6,710,917 B2 * | 3/2004 | Mann et al. | 359/365 |
| 6,750,948 B2 * | 6/2004 | Omura | 355/53 |

FOREIGN PATENT DOCUMENTS

| | | |
|---|---|---|
| EP | 0480617 | 9/1996 |
| EP | 0779528 | 6/1997 |
| EP | 0947882 | 10/1999 |
| EP | 0252734 | 5/2000 |
| WO | WO 99/57606 | 11/1999 |

* cited by examiner

*Primary Examiner*—Thong Nguyen
(74) *Attorney, Agent, or Firm*—Ohlandt, Greeley, Ruggiero & Perle, L.L.P.

(57) ABSTRACT

There is provided a microlithographic projector lens for EUV-lithography with a wavelegth in a range of 10–30 nm, an incident aperture diaphragm and an emergent aperture diaphragm for the transformation of an object field in an object plane into an image field in an image plane. The invention has a microlithographic projector lens that includes a first, second, third, fourth, fifth, sixth, seventh and eighth mirror, and a beam path from the object plane to the image plane that is free from obscuration.

79 Claims, 11 Drawing Sheets

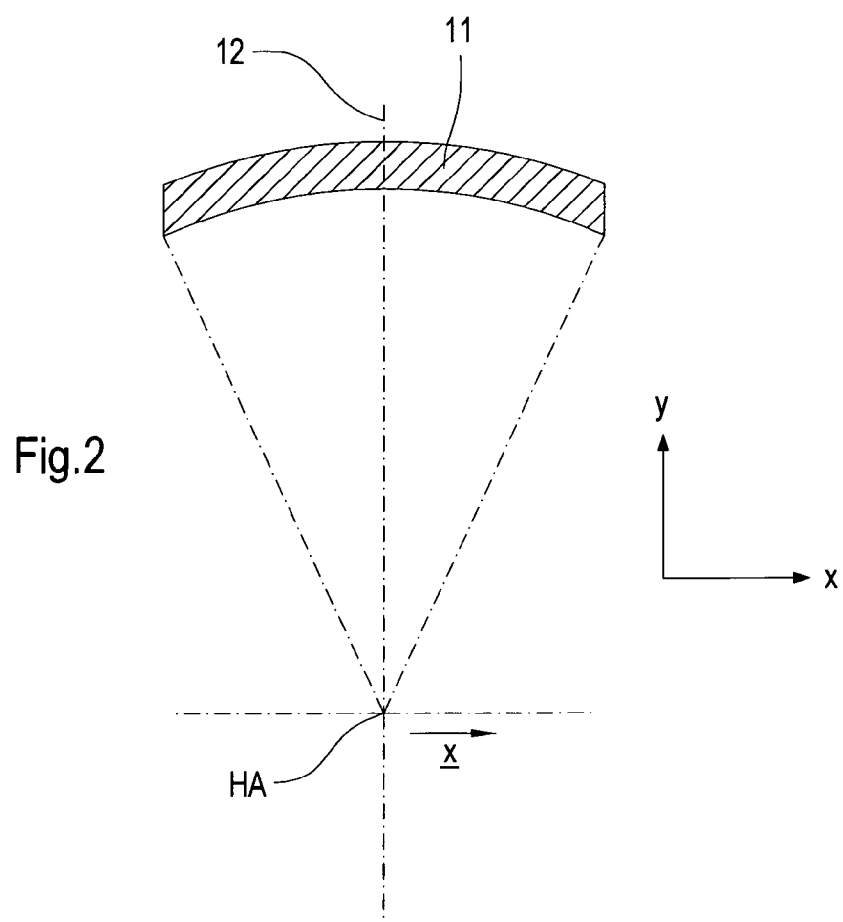

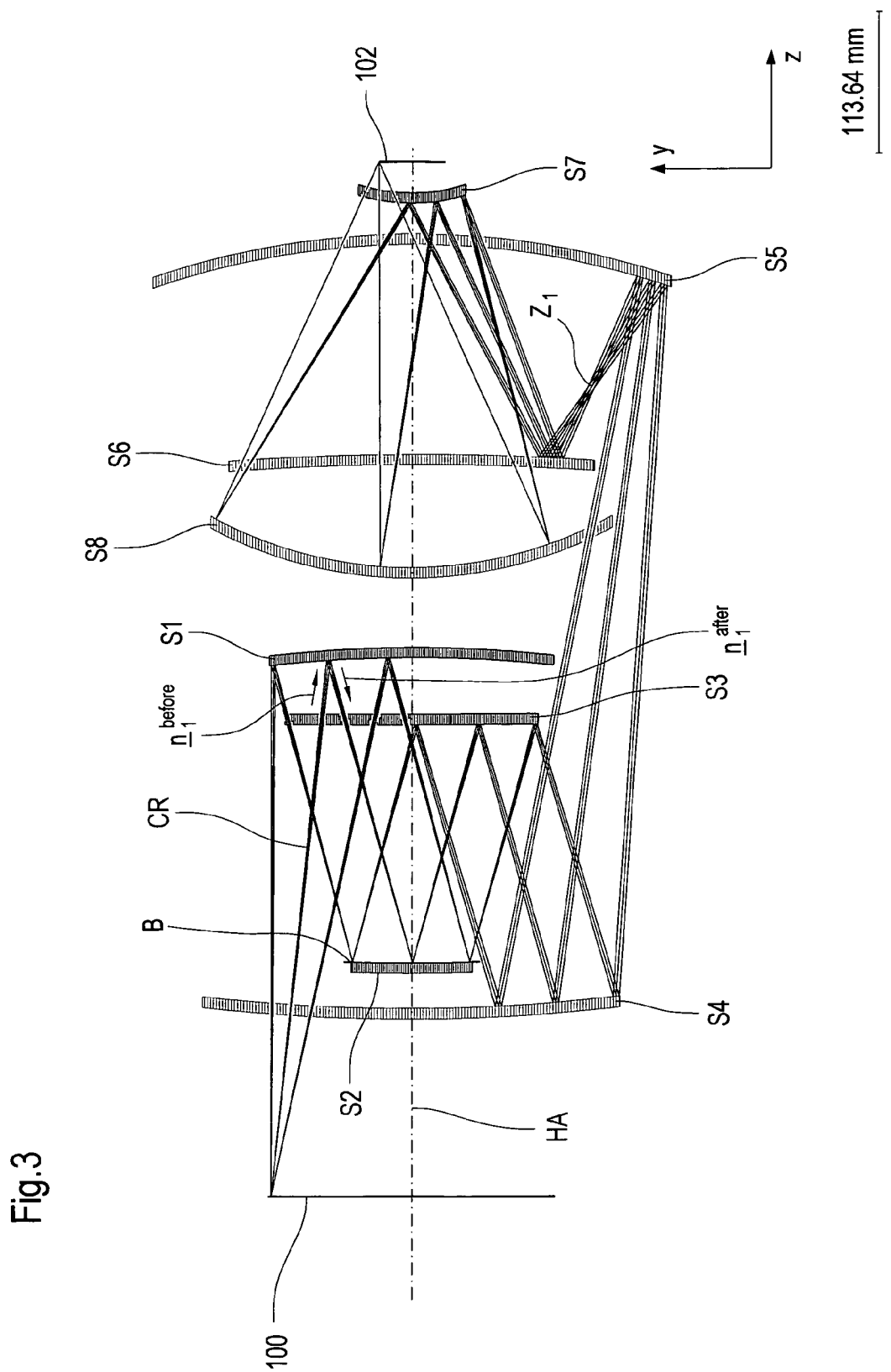

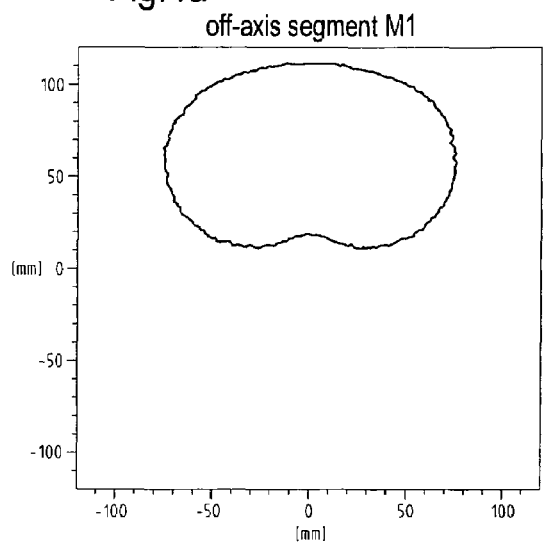
Fig.4a off-axis segment M1
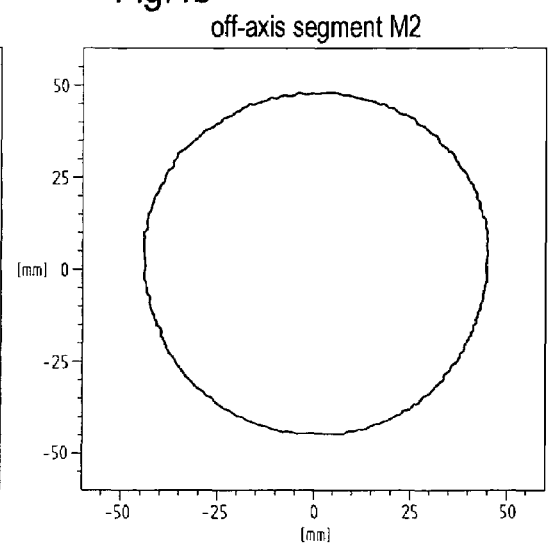
Fig.4b off-axis segment M2
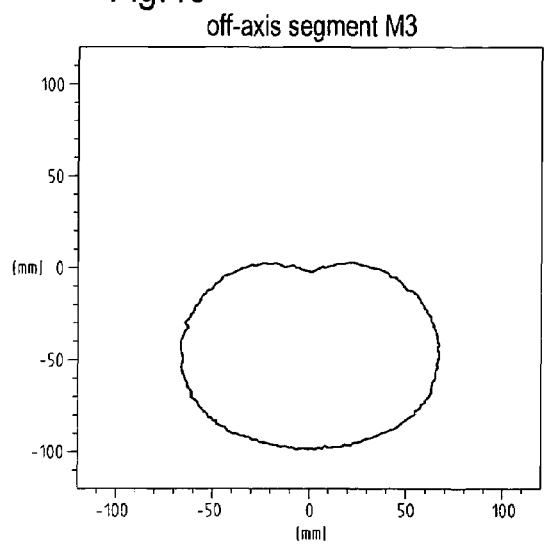
Fig.4c off-axis segment M3
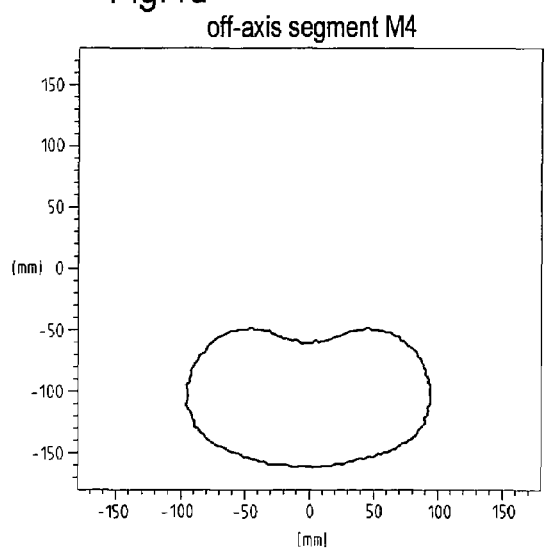
Fig.4d off-axis segment M4

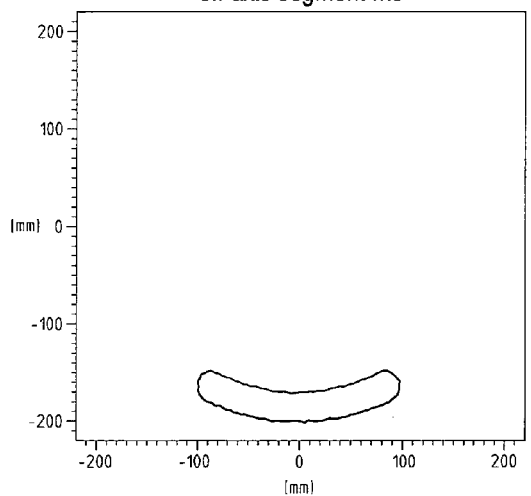
Fig.4e off-axis segment M5
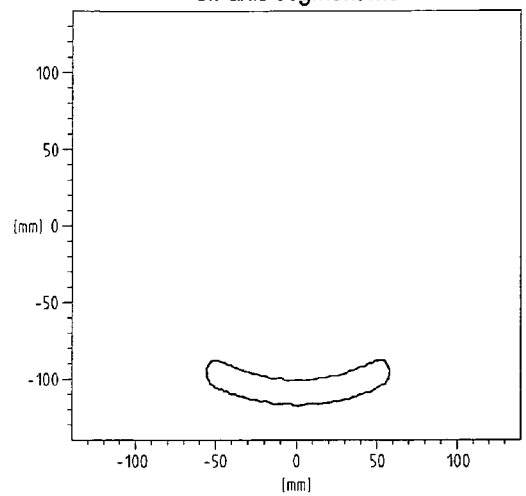
Fig.4f off-axis segment M6
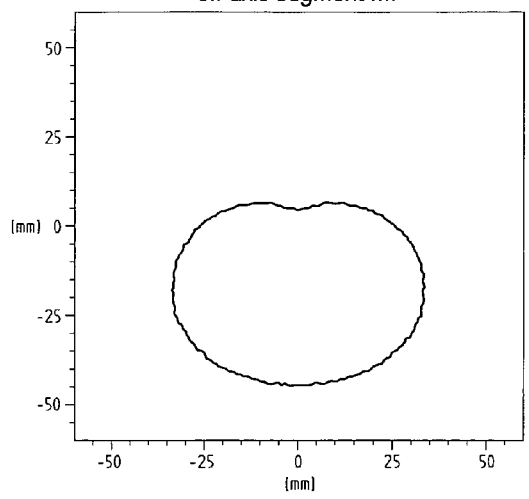
Fig.4g off-axis segment M7
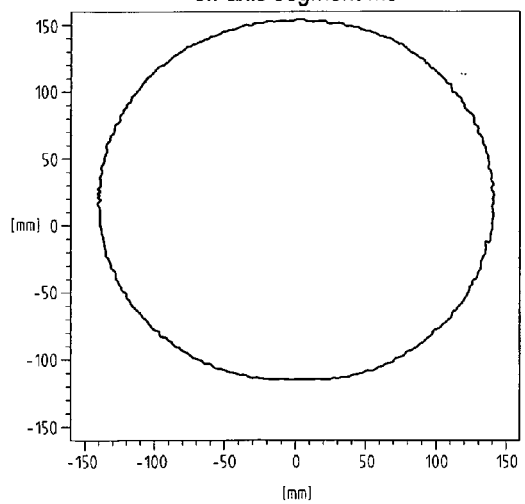
Fig.4h off-axis segment M8

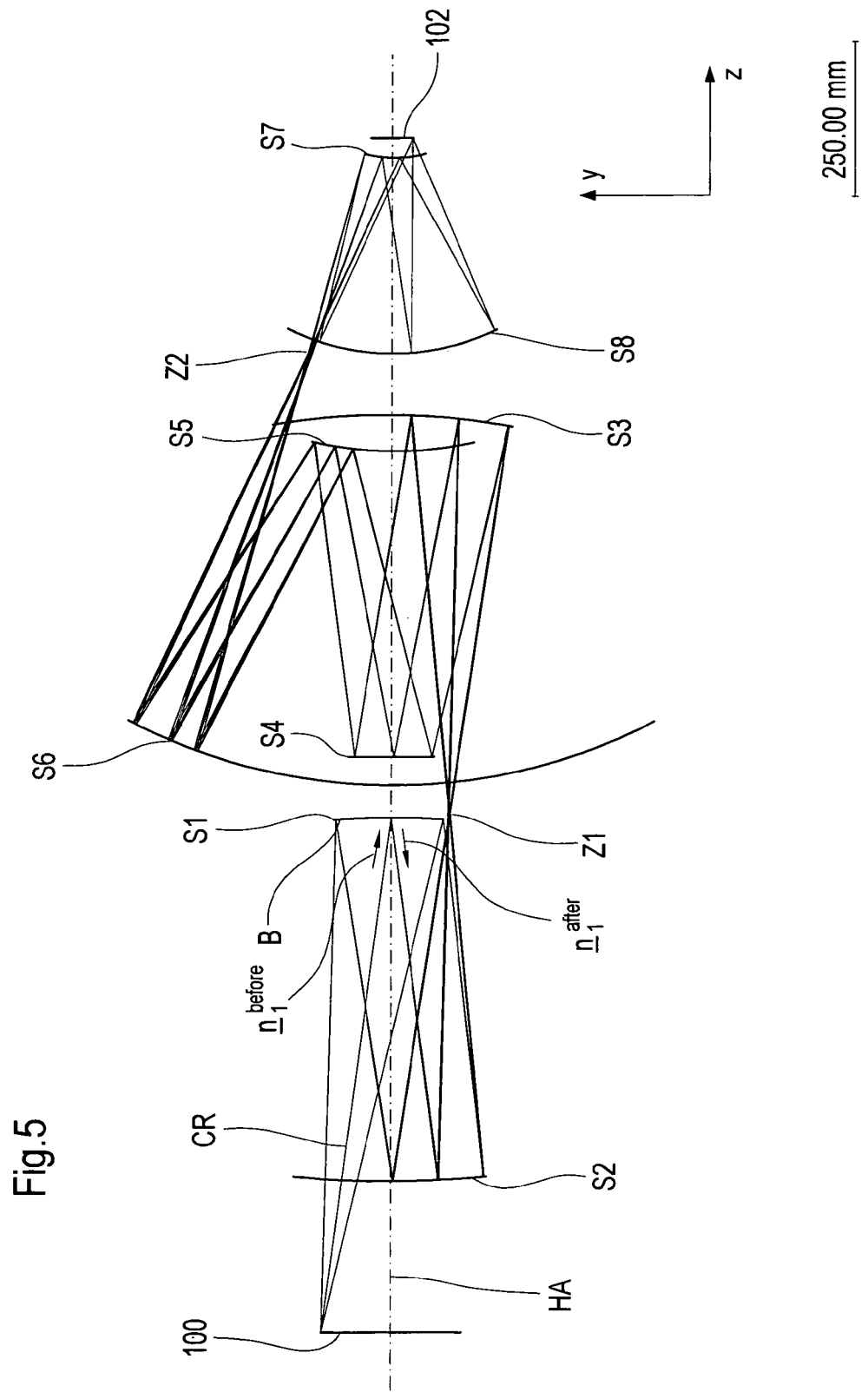

off-axis segment M1 off-axis segment M2 off-axis segment M3 off-axis segment M4

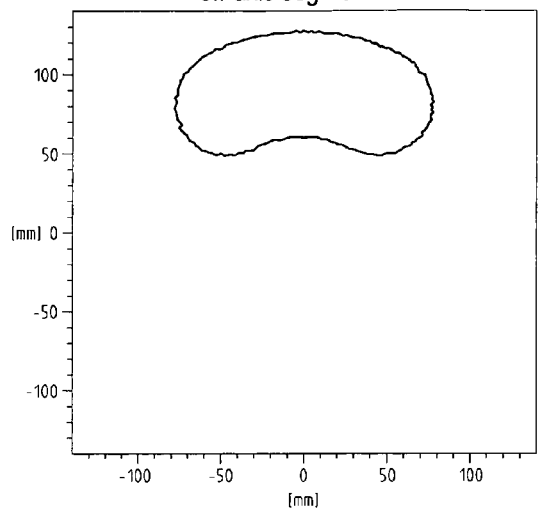
Fig.6e off-axis segment M5
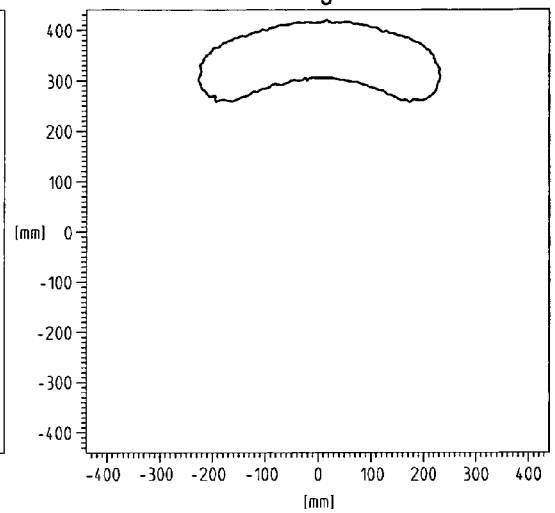
Fig.6f off-axis segment M6
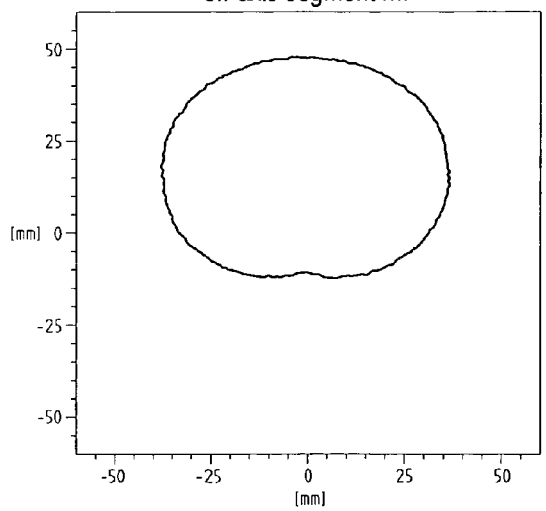
Fig.6g off-axis segment M7
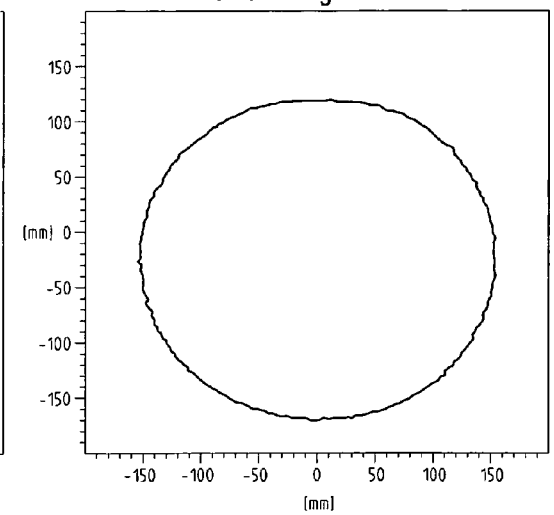
Fig.6h off-axis segment M8

TABLE 4

| ELEMENT NUMBER | RADIUS | THICKNESS | DIAMETER | TYPE |
|---|---|---|---|---|
| OBJECT | INF | 846.0618 | | |
| | | APERTURE DIAPHRAGM | 174.4481 | |
| | | 0.0000 | | |
| S1 | A(1) | -596.9226 | 174.6201 | REFL |
| S2 | A(2) | 1258.0118 | 302.7847 | REFL |
| S3 | A(3) | -560.6789 | 376.8895 | REFL |
| S4 | A(4) | 502.0689 | 132.7627 | REFL |
| S5 | A(5) | -548.1913 | 251.5133 | REFL |
| S6 | 869.9668 CC | 1025.6939 | 825.4854 | REFL |
| S7 | A(6) | -318.8926 | 93.9960 | REFL |
| S8 | A(7) | 349.2051 | 327.8538 | REFL |
| IMAGE | INF | | 56.5279 | |

ASPHERIC CONSTANT $$Z = \frac{(CURV)Y^2}{1 + (1-(1+K)(CURV)^2 Y^2)^{1/2}} + (A)Y^4 + (B)Y^6 + (C)Y^8 + (D)Y^{10}$$

| ASPHERIC PROFILE | CURV | K | A | B | C | D |
|---|---|---|---|---|---|---|
| A(1) | -0.00077091 | 0.000000 | 1.74667E-09 | 3.88468E-14 | 2.31479E-19 | -1.93103E-23 |
| A(2) | 0.00069673 | 0.000000 | -3.24472E-10 | 2.27112E-15 | 7.69172E-21 | 7.04100E-26 |
| A(3) | -0.00095818 | 0.000000 | -8.63211E-11 | -3.33704E-16 | 3.53842E-21 | -2.98818E-26 |
| A(4) | 0.00013409 | 0.000000 | 5.05967E-09 | 1.60649E-13 | -2.50451E-18 | -6.77039E-22 |
| A(5) | 0.00174877 | 0.000000 | -1.31667E-09 | 7.91407E-15 | -1.05690E-19 | 2.09186E-24 |
| A(6) | 0.00451027 | 0.000000 | 7.10441E-08 | 3.63352E-12 | -1.83737E-17 | 1.18169E-20 |
| A(7) | 0.00267159 | 0.000000 | 2.02896E-10 | 2.44899E-15 | 2.34247E-20 | 2.04113E-25 |

Reference wavelength = 13.0 nm
Imaging scale = -0.25
Image-side aperture = 0.40

Fig.8

TABLE 2

| ELEMENT NUMBER | RADIUS | THICKNESS | DIAMETER | TYPE |
|---|---|---|---|---|
| OBJECT | INF | 437.8550 | | |
| S1 | A(1) | -248.1062 | 218.4102 | REFL |
| | APERTURE DIAPHRAGM 0.0000 | | 91.5283 | |
| S2 | A(2) | 193.6511 | 91.5770 | REFL |
| S3 | A(3) | -230.6805 | 193.7182 | REFL |
| S4 | A(4) | 619.7098 | 320.2546 | REFL |
| S5 | A(5) | -169.8751 | 398.3988 | REFL |
| S6 | A(6) | 202.7900 | 280.0000 | REFL |
| S7 | A(7) | -293.6734 | 85.8365 | REFL |
| S8 | A(8) | 326.9836 | 308.4810 | REFL |
| IMAGE | INF | | 55.0127 | |

ASPHERIC CONSTANT $$Z = \frac{(CURV)Y^2}{1 + (1-(1+K)(CURV)^2 Y^2)^{1/2}} + (A)Y^4 + (B)Y^6 + (C)Y^8 + (D)Y^{10} + (E)Y^{12} + (F)Y^{14} + (G)Y^{16} + (H)Y^{18} + (J)Y^{20}$$

| ASPHERIC PROFILE | CURV | K / E | A / F | B / G | C / H | D / J |
|---|---|---|---|---|---|---|
| A(1) | -0.00123747 | 0.000000 / 2.27258E-27 | 2.31212E-09 / -4.42780E-32 | -1.20823E-14 / 0.00000E+00 | 5.14612E-19 / 0.00000E+00 | -3.39768E-23 / 0.00000E+00 |
| A(2) | 0.00016948 | 0.000000 / -4.21257E-24 | -1.89814E-08 / 5.69674E-28 | -2.29358E-13 / 0.00000E+00 | -4.85183E-19 / 0.00000E+00 | 1.15028E-20 / 0.00000E+00 |
| A(3) | -0.00011398 | 0.000000 / -6.74819E-28 | 6.83150E-09 / 2.38485E-32 | -7.67300E-14 / 0.00000E+00 | -1.83359E-18 / 0.00000E+00 | 5.15096E-23 / 0.00000E+00 |
| A(4) | 0.00052128 | 0.000000 / -3.14527E-29 | 1.30246E-09 / 2.08197E-34 | 2.58343E-15 / 0.00000E+00 | -1.56164E-19 / 0.00000E+00 | 2.66615E-24 / 0.00000E+00 |
| A(5) | -0.00182108 | 0.000000 / 6.43317E-30 | 1.19681E-09 / 9.29849E-36 | -5.86576E-16 / 0.00000E+00 | 1.80550E-19 / 0.00000E+00 | -1.61183E-24 / 0.00000E+00 |
| A(6) | -0.00107055 | 0.000000 / 1.34840E-28 | 2.53003E-08 / 6.67275E-31 | -1.45839E-12 / 0.00000E+00 | 7.48859E-17 / 0.00000E+00 | -1.88858E-21 / 0.00000E+00 |
| A(7) | 0.00584900 | 0.000000 / -9.50902E-24 | 5.51082E-08 / -1.70958E-26 | 9.28811E-13 / 0.00000E+00 | -4.97336E-16 / 0.00000E+00 | -6.35635E-20 / 0.00000E+00 |
| A(8) | 0.00289780 | 0.000000 / 1.06923E-30 | 4.07773E-10 / 3.39378E-35 | 3.17817E-15 / 0.00000E+00 | 2.23903E-20 / 0.00000E+00 | 1.62047E-25 / 0.00000E+00 |

Reference wavelength = 13.0 nm
Imaging scale = 0.25
Image-side aperture = 0.40

Fig.9

8-MIRROR MICROLITHOGRAPHY PROJECTION OBJECTIVE

CROSS-REFERENCE TO RELATED APPLICATIONS

The present application is a continuation application of PCT/EP01/12110 which was filed on Oct. 19, 2001 and which is incorporated by reference herein. PCT/EP01/12110 claimed priority of (a) German Patent Application 100 52 289 filed Oct. 20, 2000 and (b) U.S. Provisional Patent Application Ser. No. 60/255,216, filed on Dec. 13, 2000.

BACKGROUND OF THE INVENTION

1. Field of the Invention

The invention relates to a microlithography objective that provides a light path for a light bundle from an object field in an object plane to an image field in an image plane, a projection exposure apparatus with such an projection exposure objective and a usage of such a projection exposure system for processing of chips.

2. Description of the Prior Art

Lithography with wavelengths of <193 nm, particularly EUV lithography with λ =11 nm or λ=13 nm are discussed as possible techniques for imaging of structures of <130 nm, and more preferably of <100 nm. The resolution of a lithographic system is described by the following equation:

$$RES = k_1 \cdot \frac{\lambda}{NA}$$

wherein $k_1$ denotes a specific parameter of the lithography process, λ denotes the wavelength of the incident light and NA denotes the numerical aperture of the system on the image side.

For imaging systems in the EUV range, reflective systems with multilayers are used substantially as optical components. Preferably, Mo/Be systems are used as multilayer systems for λ=11 nm and Mo/Si systems are used for λ=13 nm.

The reflectivity of the multilayer systems used currently lies in the range of approximately 70%. Therefore a projection objective for EUV microlithography should have as few optical components as possible to achieve a sufficient light intensity.

In order to achieve a resolution that is as high as possible, on the other hand, it is necessary that the system has an aperture that is as large as possible on the image side.

For lithography systems, it is advantageous if the beam path or so called light path within a projection objective is free of shadows or obscurations. The projection objectives should have no mirrors with transmissive areas, especially openings, since transmissive areas lead to shading. If the objective does not have mirrors with transmissive areas, then the objective has an obscuration-free beam path and the exit pupil of the objective is free of shading and free of obscurations. Furthermore, the aperture diaphragm of such an objective does not need to have a shading device. A disadvantage of systems with an exit pupil shaded, e.g., a so-called Schwarzschild mirror systems, is that structures of specific size can be imaged only with restrictions. The exit pupil is defined as the image of the aperture diaphragm formed by the optical elements arranged in the light path of the objective between the aperture diaphragm and the image plane.

4-Mirror systems for microlithography have become known, for example, from U.S. Pat. No. 5,315,629 or EP 0 480,617 B1. Such systems, however, permit a numerical aperture only of NA=0.1 on the image side with a sufficient field size of at least 1.0 mm scanning slit width. The limit of resolution lies in the range of 70 nm with the use of x-ray light with a wavelength of 10 to 30 nm.

6-Mirror systems for microlithography have been made known from the publications U.S. Pat. No. 5,153,898; EP-A-0 252,734; EP-A-0 947,882; US-A-5,686,728; EP 0 779,528; U.S. Pat. No. 5,815,310; WO 99/57606; and U.S. Pat. No. 6,033,079.

Such 6-mirror systems have a numerical aperture of <0.3 on the image side, which leads to a resolution limit in the range of 30 nm with the use of x-ray light with a wavelength of 10–30 nm.

Another disadvantage of both 4-mirror and 6-mirror systems is the fact that they provide only a few possibilities for correction of imaging errors.

A projection objective for microlithography with eight mirrors has become known from U.S. Pat. No. 5,686,728. This projection objective has a high numerical aperture of NA=0.55 on the image side. Of course, a projection objective as it is known from U.S. Pat. No. 5,686,728 is suitable only for wavelengths longer than 126 nm, since, for example, the angle of incidence of the chief ray of the field point, which lies on the axis of symmetry in the center of the object field, is so large that this 8-mirror system cannot be operated in the EUV wavelength region of 10 to 30 nm. Another disadvantage of the system according to U.S. Pat. No. 5,686,728 is the fact that all eight mirrors are made aspheric and that the angle of the chief ray at the object has a value of 13° with a numerical aperture of 0.11 on the object side.

BRIEF SUMMARY OF THE INVENTION

There is provided a projection objective that provides a light path for a light bundle from an object field in an object plane to an image field in an image plane. The projection objective includes a first mirror, a second mirror, a third mirror, a fourth mirror, a fifth mirror, a sixth mirror, a seventh mirror, and an eighth mirror. The light path is provided via the eight mirrors and is free of obscuration. The light bundle includes light with a wavelength in a range of 10–30 nm. The object field represents a segment of a ring field with an axis of symmetry that is perpendicular to an optical axis. The light bundle has a chief ray of a field point that lies on an axis of symmetry and in a center of the object field. The projection objective has therein a right-handed coordinate system with an x axis, a y axis and a z axis. The z axis runs parallel to the optical axis and the z axis points from the object field to the image field. The y axis runs parallel to the axis of symmetry and the y axis points from the optical axis to the object field. For each of the eight mirrors i (i=1 to 8) there is a characteristic quantity $C_i$, which is defined as a scalar product of a unit vector x in a direction of the x axis and a vector product between one unit vector $n_i^{before}$, which has a direction of the chief ray striking an ith mirror, and a unit vector $n_i^{after}$, which has a direction of the chief ray reflected at the ith mirror, thus $C_i = x(n_i^{before} \times n_i^{after})$. Where $C_1 > 0$ applies to the first mirror, $C_2 < 0$ applies to the second mirror, $C_5 < 0$ applies to the fifth mirror, and $C_6 > 0$ applies to the sixth mirror.

There is also provided another projection objective that provides a light path for a light bundle from an object field in an object plane to an image field in an image plane. The projection objective includes a first mirror, a second mirror, a third mirror, a fourth mirror, a fifth mirror, a sixth mirror, a seventh mirror, and an eighth mirror. The light path is provided via the eight mirrors and is free of obscuration. The light bundle includes light with a wavelength in a range of 10–30 nm. The projection objective has a drift path that is formed between two of the eight mirrors. The drift path is longer than 70% of a structural length of the projection objective.

There is further provided yet another projection objective that provides a light path for a light bundle from an object field in an object plane to an image field in an image plane. The projection objective includes a first mirror, a second mirror, a third mirror, a fourth mirror, a fifth mirror, a sixth mirror, a seventh mirror, and an eighth mirror. The light path is provided via the eight mirrors and is free of obscuration. The light bundle includes light with a wavelength in a range of 10–30 nm. The projection objective has a drift path that is formed between two of the eight mirrors. The drift path is longer than 70% of a structural length of the projection objective.

BRIEF DESCRIPTION OF THE DRAWINGS

The invention will be described below on the basis of examples of embodiments.

FIG. 2: the ring field in the object plane or image plane of the objective;

FIG. 3: a first embodiment of a projection objective according to the invention with eight mirrors with one intermediate image;

FIGS. 4A–4H: the off-axis segments of mirrors S1–S8 of the first embodiment;

FIG. 5: a second embodiment of a projection objective according to the invention with seven aspheric mirrors and one spherical mirror, as well as two intermediate images;

FIGS. 6A–6H: the off-axis segments of mirrors S1–S8 of the second embodiment;

FIG. 8: a table with optical data for the embodiment according to FIG. 3; and

FIG. 9: a table with optical data for the embodiment according to FIG. 5.

DETAILED DESCRIPTION OF THE INVENTION

Figure 1:
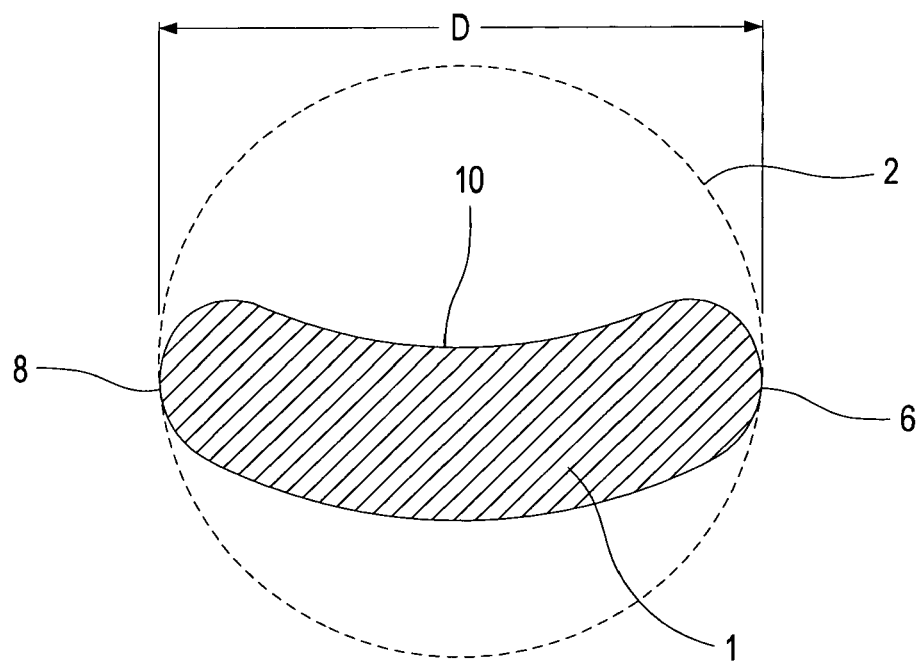
FIG. 1: the shape of an off-axis segment of a mirror.

A first object of the invention is to provide a suitable projection objective for lithography with short EUV wavelengths in the range of 10 to 30 nm, which is characterized by a large numerical aperture and improved possibilities of imaging correction when compared with previously known projection systems for EUV microlithography.

Another object of the invention consists of indicating a microlithography projection objective for lithography with wavelengths of $\leq 193$ nm, which has both a large aperture and which can be manufactured in a simple manner.

According to the invention, the first object is solved by a microlithography projection objective for EUV lithography with a wavelength in the range of 10–30 nm by the fact that the microlithography projection objective has eight mirrors instead of four or six mirrors.

The inventors have recognized surprisingly that such an objective makes available both a sufficient light intensity as well as a sufficiently large numerical aperture in order to meet the requirements for high resolution as well as to make available sufficient possibilities for imaging correction.

In order to achieve a resolution as high as possible, in an advantageous embodiment, the numerical aperture of the projection objective on the image side is greater than 0.2.

In order to minimize the angle of incidence of the chief ray of the field point, which lies on the axis of symmetry and in the center of the object field, advantageously, the numerical aperture on the image side of the projection system according to the invention is limited to NA<0.5.

In order to force a bundle of light rays in the direction of the optical axis (HA) and to avoid off-axis segments of the mirrors having a large distance to the optical axis (HA) in a particular advantageous embodiment the projection objective is designed in such a way that at least one intermediate image of the object field is formed in the beam path of the projection objective between object field and image field.

In the present application, that part of a mirror on which the light rays that are guided through the projection objective impinge is denoted as the off-axis segment of a mirror. The distance of the off-axis segment from the optical axis (HA) in the present application is the distance of the point of incidence of the chief ray of the central field point onto the off-axis segment of the mirror from the optical axis (HA).

In order to minimize the angle of incidence on the first mirror of the projection objective according to the invention, in a particularly advantageous embodiment of the invention, a diaphragm, which is preferably circular or nearly circular, is arranged in the light path between first and second mirrors, preferably on or in the vicinity of the first mirror or on or in the vicinity of the second mirror. "In the vicinity" in the present Application is understood as the distance of the diaphragm from the closest mirror that is less than $\frac{1}{10}^{th}$ of the distance from the preceding mirror to the mirror in the vicinity of the diaphragm. For example, "in the vicinity of S2" means that the following applies:

$$\overline{BS_2} < \frac{1}{10} \overline{S1S2},$$

wherein $\overline{BS_2}$ denotes the distance of the diaphragm to the second mirror and $\overline{S1S2}$ denotes the distance between the first and second mirrors. Such an arrangement permits a minimal separation of the beam bundles which reduces the angles of incidence on the first, second and third mirrors in the front part of the objective. In addition, such an arrangement of the diaphragm yields a configuration where the off-axis segment of the third mirror lies directly below the optical axis and is nearly in a mirror image of the off-axis segment of the first mirror S1. Furthermore, the angles of incidence on the fourth and fifth mirrors are also reduced, since the distance of the bundle of light rays from the optical axis is minimal between the fourth and fifth mirrors.

In order to produce small angles of incidence on the mirrors, it is further of advantage, if the distances of the off-axis segment of the mirrors to the optical axis (HA) are kept small. Since these distances can be varied randomly by an appropriate scaling, they are characterized by their size ratio relative to the structural length of the objective in the present application. It is particularly advantageous, if the following relation is fulfilled:

the distance of the off-axis segment of each mirror to the optical axis (HA) is smaller than 0.3*structural length of the projection objective, and preferably:

the distance of the off-axis segment of each mirror to the optical axis (HA) is smaller than 0.25*structural length of the projection objective.

In a further embodiment of the invention, the radius of curvature of at least one mirror is larger than the structural length of the projection objective.

In this application the distance of the off-axis segment of a mirror to the optical axis (HA) is the distance between that point of the off-axis segment onto which the chief ray (CR) of a light bundle emerging form a field point, that lies on an axis of symmetry and in a center of an object field, impinges, and the optical axis (HA).

The distance from the object to be imaged up to its image is understood as the structural length of the projection objective in the present application. In more detail this means the structural length is the distance between the object plane and the image plane along the optical axis (HA) of the projection objective.

It is particularly advantageous, that the aforementioned condition for radius of curvature applies to the second, third and fourth mirrors, so that the paths of the light bundles from the first to the second mirror and from the third to the fourth mirror are nearly parallel. With such a configuration a minimal separation of the ray bundles and large drift paths are achieved. In the present application, the distance between the vertexes of two sequential mirrors in the light path of the light traveling through the objective is to be understood as the drift path. The aforementioned conditions contribute to small angles of incidence on the mirrors.

The projection objective can be further characterized from the sum of (a) the lengths of all drift paths between pairs of sequential mirrors in said light path, (b) the length from said object plane to a vertex of said first mirror (S1) in said light path, and (c) the length from a vertex of said eighth mirror (S8) to said image plane in said light path, as indicated in the following formula:

sum=length of drift path$_{S1S2}$+length of drift path$_{S2S3}$+length of drift path$_{S3S4}$+length of drift path$_{S4S5}$+length of drift path$_{S5S6}$+length of drift path$_{S6S7}$+length of drift path$_{S7S8}$+length from object plane to vertex$_{S1}$+length from vertex$_{S8}$ to image plane.

In a preferred embodiment, this sum is at least 2.5 times the structural length of the projection objective. The projection objective is preferably further characterized in that at least one drift path is longer than 70% of the structural length of the projection objective.

In another embodiment of the invention, the microlithography projection objective is designed such that the sine of the angle of the chief ray at the object is smaller than twice the value of the object-side aperture (NAO). This is an advantage, since obscuration or shading effects on the masks are reduced thereby.

It is a particular advantage if the projection objective has two intermediate images. The first intermediate image in a system with two intermediate images is formed preferably between the second and third mirrors. This leads to the fact that the first, second, third and fourth mirrors have off-axis segments in the vicinity of the axis. In order to assure that the off-axis segments of the mirrors are near to the axis for as many mirrors as possible in the objective part comprising the fifth, sixth, seventh and eighth mirrors, the projection objective is designed in such a way that the second intermediate image is formed in the beam path between the sixth and seventh mirrors. It is particularly preferred, if the angle of incidence of the chief ray of the field point, which lies on the axis of symmetry in the center of the object field, is smaller than 20° on all mirrors, in the case of a system with two intermediate images.

In a preferred embodiment with two intermediate images, at least one of the eight mirror surfaces is made spherical.

It is particularly advantageous if those mirrors of the objective with the largest distance of the off-axis segment are made spherical, since interferometric testability of off-axis aspheric profiles becomes difficult with an off-axis segment having a large distance to the optical axis.

In a system with two intermediate images between the second and third mirrors as well as between the sixth and seventh mirrors, the sixth mirror is the mirror with the largest distance from the optical axis. In such an embodiment, preferably the sixth mirror is formed spherical for the sake of interferometric testability.

In addition to the projection objective, the invention also makes available a projection exposure system, wherein the projection exposure system comprises an illumination device for illuminating a ring field as well as a projection objective according to the invention.

FIG. 1 shows what is to be understood as the off-axis segment of a mirror and the diameter of such an off-axis segement in the present application.

FIG. 1 shows a kidney-shaped field as an example for a projected field 1 on a mirror of the projection objective. Such a shape is expected for the off-axis segments in an objective according to the invention, if used in a microlithography projection exposure system. The enveloping circle 2 completely encloses the kidney shape and coincides with edge 10 of the kidney shape at two points 6, 8. The enveloping circle is always the smallest circle that encloses the off-axis segment. Diameter D of the off-axis segment then results from the diameter of the enveloping circle 2.

In FIG. 2, the object field 11 of a projection exposure system is shown in the object plane of the projection objective, which is imaged by means of the projection objective according to the invention in an image plane, in which a light-sensitive object is arranged, for example, a wafer. The shape of the image field corresponds to that of the object field 11. With reduction objectives as frequently used in microlithography, the image field is reduced by a predetermined factor relative to the object field. The object field 11 has the configuration of a segment of a ring field. The segment has an axis of symmetry 12.

The image field represents a segement of a ring field. The segement has an axis of symmetry and an extension perpendicular to the axis of symmetry and the extension is at least 20, preferably at least 25 mm.

In addition, the axes that span the object and image planes, namely the x axis and the y axis are depicted in FIG. 2. As can be seen from FIG. 2, the axis of symmetry 12 of ring field 11 runs in the direction of the y-axis. At the same time, the y axis coincides with the scanning direction of an EUV projection exposure system, which is designed as a ring-field scanner. The x-direction is then the direction that runs perpendicular to the scanning direction, within the object plane. Additionally, the unit vector x in the direction of the x axis is depicted in FIG. 12.

The optical axis HA of the projection objective extends in the z direction.

A first example of embodiment of a projection objective, which can be utilized in the EUV range with $\lambda = 10-30$ nm and is characterized by small angles of incidence on all mirrors, is shown in FIG. 3.

The object in object plane 100 is imaged by means of the projection objective in the image plane 102, in which, for example, a wafer can be arranged. The projection objective according to the invention comprises a first mirror S1, a second mirror S2, a third mirror S3, a fourth mirror S4, a fifth mirror S5, a sixth mirror S6, a seventh mirror S7 as well as an eighth mirror S8. In the example of embodiment shown in FIG. 3, all mirrors S1, S2, S3, S4, S5, S6, S7 and S8 are formed as aspheric mirrors. The system comprises one intermediate image Z1 between the fifth S5 and the sixth S6 mirrors. The y and z directions of the right-handed x, y and z coordinate system are also depicted in FIG. 3. The z axis runs parallel to the optical axis HA and the orientation of the z axis points from the object plane 100 to the image plane 102. The y axis runs parallel to the axis of symmetry 12 of the object field 11. The object field 11 is shown in FIG. 2. The orientation of the y-axis is from the optic axis HA to the object field 11 as shown in FIG. 2. Additionally, the unit vectors $n_1^{before}$ and $n_1^{after}$, which indicate the direction of the chief ray CR before and after the reflection at the first mirror, are depicted in FIG. 3 for the first mirror S1. The chief ray CR emerges from an object point on the axis of symmetry 12 in the center of the object field 11 shown in FIG. 2 and runs in a direction to the image field. The unit vectors result analogously for the other mirrors S2 to S8.

The system is centered relative to the optical axis HA and is telecentric on the image side, i.e., in the image plane 102. Image-side telecentry is understood to mean that the chief ray CR impinges onto the image plane 102 at an angle close to or approximately 90°. The chief ray CR is reflected at the fourth mirror S4 in such a way that it runs in a direction away from the optical axis to the fifth mirror S5.

The following inequalities result as characteristic quantities $C_i$ for the mirrors: $C_1>0$, $C_2<0$, $C_3>0$, $C_4<0$, $C_5<0$, $C_6>0$, $C_7<0$, $C_8>0$. The characteristic quantities are defined as the scalar product between the unit vector x in the direction of the x axis and the vector product between one unit vector $n_i^{before}$, which has the direction of the chief ray impinging onto the ith mirror, and a unit vector $n_i^{after}$, which has the direction of the chief ray reflected at the ith mirror, thus $$C_i = x * (n_i^{before} \times n_i^{after}).$$

The quantity $C_i$ provides clear information of whether a chief ray CR impinging onto a mirror is reflected in the positive or negative y direction, whereby it is important whether the chief ray CR enters from the direction of the object plane 100 or from the direction of the image plane 102. It follows that $c_i>0$ applies if the chief ray impinges onto the mirror from the direction of the object plane 100 and is reflected in the direction of the negative y axis. $C_i<0$ applies if the chief ray impinges the mirror from the direction of the object plane 100 and is reflected in the direction of the positive y axis. $C_i>0$ applies if the chief ray impinges the mirror from the direction of the image plane 102 and is reflected in the direction of the positive y axis, and $C_i<0$, applies if the chief ray impinges the mirror from the direction of the image plane 102 and is reflected in the direction of the negative y axis.

Within the mirror system, in order to keep light losses as well as coating-induced wavefront aberrations as small as possible, the angle of incidence of the chief ray CR of the central field point on the respective mirror surface is smaller than 26° in the example of embodiment according to FIG. 3. The angles of incidence of the chief ray of the central field point are reproduced in the following Table 1:

TABLE 1

Angles of incidence of the chief ray of the central field point for the example of embodiment of FIG. 3.

| Mirror | Angle of incidence |
|--------|--------------------|
| 1 | 10.5° |
| 2 | 15.0° |
| 3 | 14.9° |
| 4 | 11.0° |
| 5 | 10.6° |
| 6 | 25.6° |
| 7 | 15.7° |
| 8 | 4.7° |

The 8-mirror objective shown in FIG. 3 has an image-side aperture of NA=0.4 and a scanning slit width of 1 mm. The following measures were taken in order to minimize the angle of incidence on the individual mirrors: The angle of the chief ray at object 100 is minimized, whereby the aperture on the object side NAO=0.1. The angle of incidence on the first mirror is minimized in this way. The maximal chief-ray angle at the object amounts to only 6.1° with the indicated numerical aperture NAO of 0.1 on the object side and is thus substantially smaller than the maximal chief-ray angle of 13° at the object according to U.S. Pat. No. 5,686,728.

The physical diaphragm (B) is localized on the second mirror S2. This permits a minimal separation of the beam bundles in the front part of the objective, which reduces the angles of incidence on S1, S2 and S3. Additionally, this brings about the circumstance that the off-axis segment of mirror S3 lies directly under the optical axis and nearly in a mirror image to the off-axis segment of mirror S1, in contrast, for example, to the 8-mirror objective for wavelengths of >126 nm shown in U.S. Pat. No. 5,686,728. Based on this measure, the angles of incidence on S4 and S5 are smaller, since the distance of the beam bundle from the optical axis is minimal between S4 und S5. The off-axis segments of the individual mirrors are shown in FIGS. 4A–4H. The off axis segment of each mirror in FIGS. 4A–4H are depicted in the x-y-plane as the ring field shown in FIG. 2 is. Therefore, the x-axis and their direction as well as the y-axis and their direction are the same as in FIG. 2. The optical axis (HA) of the projection objective runs along the z-axis and is situated in the x-y-plane in the orgin (0,0) of the coordinate system. The distance of the off-axis segment of a mirror to the optical axis (HA) is the distance between that point of the off-axis segment onto which the chief ray (CR) of a light bundle emerging from a field point, that lies on an axis of symmetry and in a center of an object field, impinges, and the optical axis (HA).

FIG. 4A shows the off-axis segment on mirror S1, FIG. 4B shows the off-axis segment of mirror S2, FIG. 4C shows the off-axis segment of mirror S3, FIG. 4D shows the off-axis segment of mirror S4, FIG. 4E shows the off-axis segment of mirror S5, FIG. 4F shows the off-axis segment of mirror S6, FIG. 4G shows the off-axis segment of mirror S7 and FIG. 4H shows the off-axis segment of mirror S8 of the embodiment of an 8-mirror objective according to FIG. 3. As can be seen clearly from FIGS. 4A–4H, all off-axis segments of mirrors S1 to S8 are free of shadows or obscurations. This means that the beam path of a light bundle, which passes through the objective from the object plane to the image plane, and which images the object field in the object plane into the image field in the image plane is free of shadows and obscurations.

In addition, the radii of curvature of at least one of mirrors S2 to S4 is selected as large, preferably larger then the structural length of the projection objective, so that drift paths that are as large as possible are formed, and the paths of the beam bundles from S1 to S2 and from S3 to S4 lie nearly parallel. The same applies to the paths of the beam bundles from S2 to S3 and from S4 to S5. A minimal separation of the beam bundles also results from this.

The wavefront has a maximal rms value of less than 0.030 λ. Distortion is corrected via the scanning slit to a maximal value of 1 nm and has the form of a third-degree polynomial, so that the dynamic distortion mediated by the scanning process is minimized. The curvature of the image field is corrected by considering the Petzval condition.

The exact data of the objective according to FIG. 3 are shown in Code V format in Table 2 in the FIG. 8.

FIG. 5 shows a second embodiment of an 8-mirror objective according to the invention with mirrors S1, S2, S3, S4, S5, S6, S7 and S8. The same components as in FIG. 3 are given the same reference numbers. In particular, the x axis, the y axis and the z axis as well as the characteristic quantities are defined as in the description to FIG. 3. In FIG. 5, the physical diaphragm (B) is localized on the first mirror S1. The following apply to the characteristic quantities $C_i$, as defined in the description to FIG. 3:

$C_1 > 0, C_2 < 0, C_3 < 0, C_4 > 0, C_5 < 0, C_6 > 0, C_7 > 0, C_8 < 0.$

In order to achieve a production of an 8-mirror objective with the smallest possible expenditure and to assure an interferometric testability, it is provided in the case of this objective to make the mirror with a off-axis segment having the largest distance to the optical axis spherical.

In order to minimize the angles of incidence and to compel the beam bundle in the direction of the optical axis and thus to limit the occurrence of off-axis segments far from the axis, the embodiment according to FIG. 5 has two intermediate images Z1, Z2.

A first subsystem (i.e., mirrors S1 and S2) images an object field into the first intermediate image (Z1). A second subsystem (i.e., mirrors S3, S4, S5 and S6) images the first intermediate image (Z1) into the second intermediate image (Z2). A third subsystem (i.e., mirrors S7 and S8) images the second intermediate image (Z2) into an image field.

In the example of embodiment shown in FIG. 5 with two intermediate images, mirrors S1, S2, S3, S4, S5 as well as S7 and S8 are aspheric, while mirror S6 which has a off-axis segment having the largest distance to the optical axis, in contrast, is spherical. The system has an aperture of NA=0.4 on the image side. Based on the example of embodiment in FIG. 5, it is clear that the first intermediate image between S2 and S3 provides for the fact that the first four mirrors S1, S2, S3, S4 have off-axis segments in the vicinity of the axis. This cannot be assured to the same extent in the back high-aperture part of the objective by the second intermediate image Z2 alone. The sixth mirror S6 thus has a off-axis segment with a large distance to the axis. If mirror S6 is formed aspheric, then it would be difficult to test it only with on-axis test optics. Thus, it is made spherical according to the invention. The angles of incidence of the chief ray of the central field point are reproduced in the following Table 3:

TABLE 3

Angles of incidence of the chief ray of the central field point for the example of embodiment of FIG. 5.

| Mirror | Angle of incidence |
| --- | --- |
| S1 | 7.5° |
| S2 | 4.4° |
| S3 | 4.6° |
| S4 | 10.5° |
| S5 | 19.4° |
| S6 | 4.6° |
| S7 | 14.0° |
| S8 | 4.2° |

The off-axis segments of the individual mirror segments are shown in FIGS. 6A–6H.

The off axis segment of each mirror in FIGS. 6A–6H are depicted in the x-y-plane as the ring field shown in FIG. 2 is. Therefore, the x-axis and their direction as well as the y-axis and their direction are the same as in FIG. 2. The optical axis (HA) of the projection objective runs along the z-axis and is situated in the x-y-plane in the orgin (0,0) of the coordinate system. The distance of the off-axis segment of a mirror to the optical axis (HA) is the distance between that point of the off-axis segment onto which the chief ray (CR) of a light bundle emerging from a field point, that lies on an axis of symmetry and in a center of an object field, impinges, and the optical axis (HA).

Figure 6A:
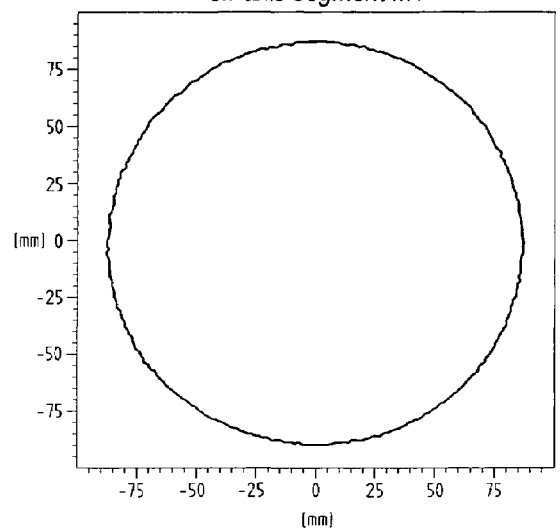
Figure 6B:
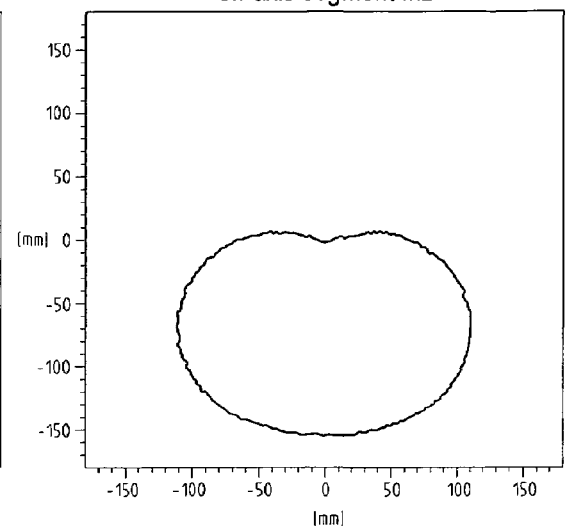
Figure 6C:
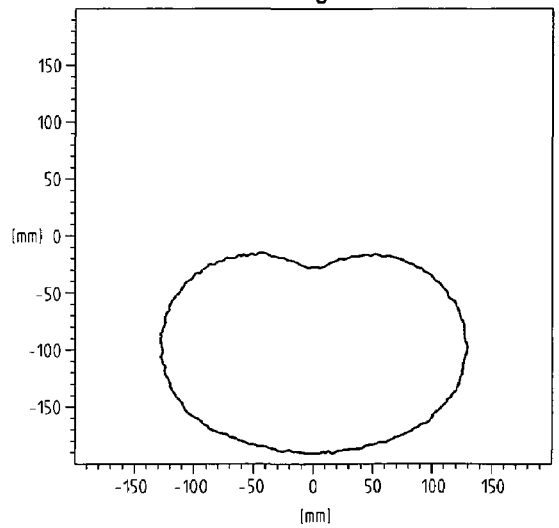
Figure 6D:
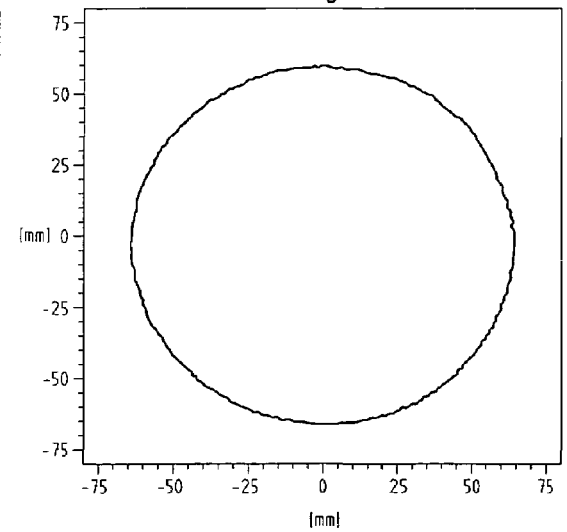

Thus, FIG. 6A shows the off-axis segment on mirror S1, FIG. 6B shows the off-axis segment of mirror S2, FIG. 6C shows the off-axis segment of mirror S3, FIG. 6D shows the off-axis segment of mirror S4, FIG. 6E shows the off-axis segment of mirror S5, FIG. 6F shows the off-axis segment of mirror S6, FIG. 6G shows the off-axis segment of mirror S7, and FIG. 6H shows the off-axis segment of mirror S8 of the embodiment of an 8-mirror objective according to FIG. 5. As can be seen clearly from FIGS. 6A–6H, all off-axis segments of mirrors S1 to S8 are free of shadows or obscurations. This means that the beam path of a light bundle, which passes through the objective from the object plane to the image plane, and which images the object field in the object plane into the image field in the image plane, is free of shadows and obscurations.

The exact data of the objective according to FIG. 5 are shown in Code V format in Table 4 in FIG. 9.

In the two forms of embodiment of the invention, the distances of the off-axis segments of the mirror are advantageously minimized in order to produce small angles of incidence on the mirrors. Since these distances can be varied randomly by an appropriate scaling, they are characterized by their existing ratio of size relative to the structural length of the objective. The ratios of the distance values of the off-axis segments to the optical axis (HA) divided by structural length are listed in Table 5 below for all mirrors of the two examples of embodiment.

TABLE 5

Ratio of distances of the off-axis segments divided by the structural length

| Mirror | Example of embodiment according to FIG. 3 | Example of embodiment according to FIG. 5 |
| --- | --- | --- |
| 1 | 0.078 | 0.000 |
| 2 | 0.000 | 0.040 |

TABLE 5-continued

Ratio of distances of the off-axis segments divided by the structural length

| Mirror | Example of embodiment according to FIG. 3 | Example of embodiment according to FIG. 5 |
|---|---|---|
| 3 | 0.062 | 0.054 |
| 4 | 0.133 | 0.002 |
| 5 | 0.221 | 0.046 |
| 6 | 0.129 | 0.179 |
| 7 | 0.025 | 0.010 |
| 8 | 0.028 | 0.016 |

The projection objective of the present invention can be employed in a projection exposure system. In addition to the projection objective, such a system should include an EUV radiation source, an illumination device that partially collects the radiation and further conducts the radiation to illuminate a ring field, a mask that bears a structure or pattern on a support system, wherein the mask is arranged in a plane of the ring field, and wherein the projection objective images an illuminated part of the mask in the image field, and a light sensitive substrate arranged in a plane of the image field.

Figure 7:
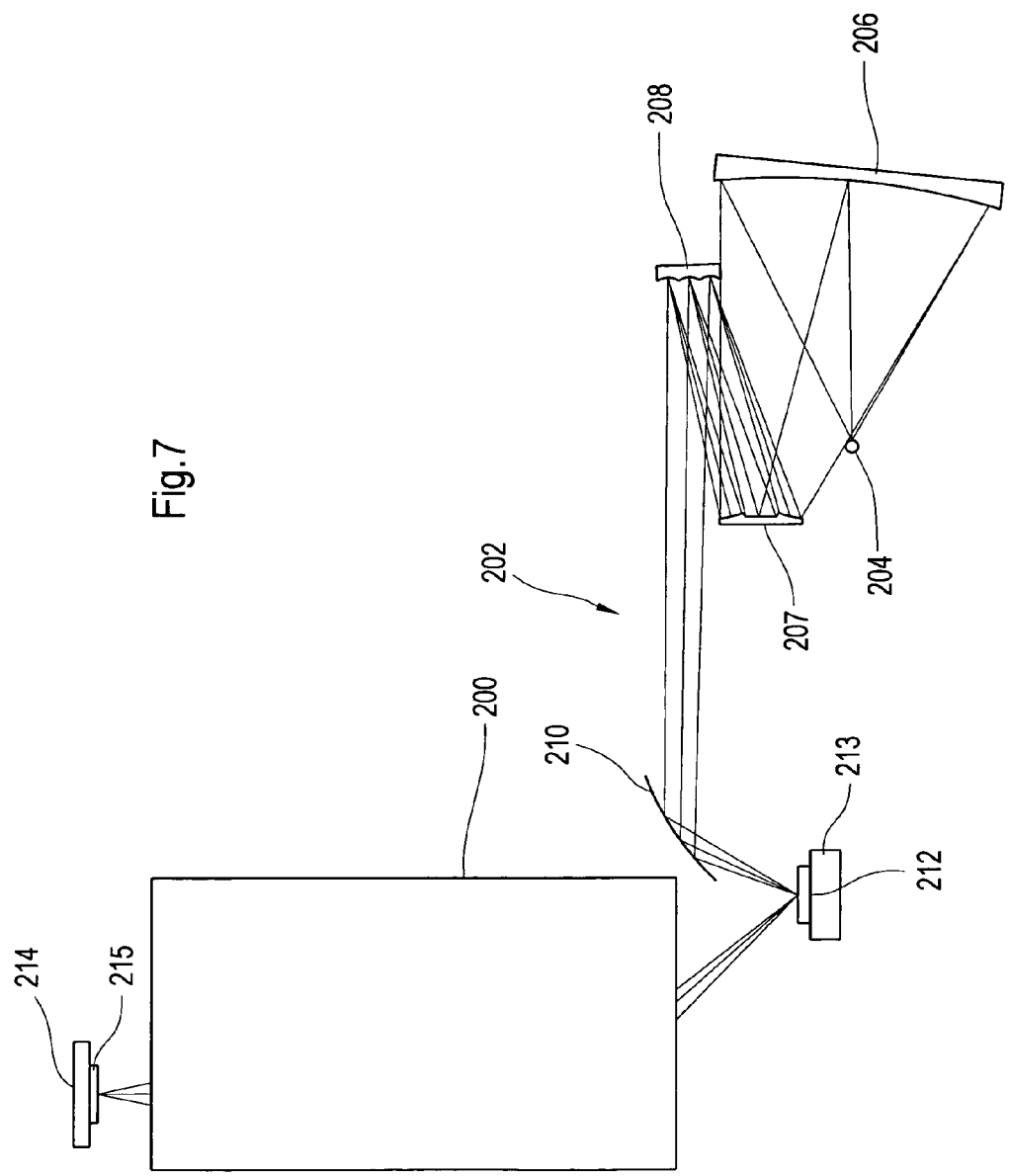
FIG. 7: a projection exposure system with an objective according to the invention.

FIG. 7 shows a projection exposure system for microlithography with an 8-mirror projection objective 200 according to the invention. The illumination system 202 may be formed, as described, for example, in EP 99-106348.8 with the title "Illumination system, particularly for EUV lithography" or U.S. Ser. No. 09/305,017 with the title "Illumination system particularly for EUV-Lithography", the disclosure content of which is fully incorporated in the present Application. Such an illumination system contains an EUV light source 204. The light of the EUV light source is collected by collector mirror 206. The reticle 212 is located on a support structure 213, and illuminated by means of a first mirror 207 comprising raster elements or so-called field raster elements, and a second mirror 208 also comprising raster elements or so-called pupil raster elements, as well as a mirror 210. The light reflected by reticle 212 is imaged onto a light-sensitive layer 215, which is situated on a carrier 214, by means of the projection objective according to the invention.

The projection exposure system of FIG. 7 can be used or the manufacturing of chips, e.g. integrated circuits. Such a method includes the step of (a) employing the projection exposure system to provide a projection beam from the EUV radiation source and the illumination system, (b) providing a substrate that is at least partially covered by a layer of radiation sensitive material, (c) using a mask to endow the projection beam with a pattern in its cross section and (d) using the projection objective to project the patterned beam onto a target portion of the layer of radiation sensitive material.

A projection objective with eight mirrors is thus indicated for the first time by the invention, which is characterized by an applicability in the EUV wavelength region with $\lambda=11$ to 30 nm and represents a particularly advantageous, compact projection objective from the constructional and manufacturing points of view.

The projection objective that has been presented is also characterized by a large aperture with a simultaneous shadow-free or obscuration-free beam path. This leads to a shadow-free exit pupil.

It should be understood by a person skilled in the art, that the disclosure content of this application comprises all possible combinations of any element(s) of any claims with any element(s) of any other claim, as well as combinations of all claims amongst each other.

The invention claimed is:

1. A projection objective that provides a light path for a light bundle from an object field in an object plane to an image field in an image plane, said projection objective comprising:
   a first mirror;
   a second mirror;
   a third mirror;
   a fourth mirror;
   a fifth mirror;
   a sixth mirror;
   a seventh mirror; and
   an eighth mirror,
   wherein said light path is provided via said eight mirrors and is free of obscuration,
   wherein said light bundle includes light with a wavelength in a range of 10–30 nm,
   wherein said object field represents a segment of a ring field with an axis of symmetry that is perpendicular to an optical axis,
   wherein said light bundle has a chief ray of a field point that lies on an axis of symmetry and in a center of said object field,
   wherein said projection objective has therein a right-handed coordinate system with an x axis, a y axis and a z axis,
   wherein said z axis runs parallel to said optical axis and said z axis points from said object field to said image field,
   wherein said y axis runs parallel to said axis of symmetry and said y axis points from said optical axis to said object field,
   wherein for each of said eight mirrors i (i=1 to 8) there is a characteristic quantity $C_i$, which is defined as a scalar product of a unit vector x in a direction of said x axis and a vector product between one unit vector $n_i^{before}$, which has a direction of said chief ray striking an ith mirror, and a unit vector $n_i^{after}$, which has a direction of said chief ray reflected at said ith mirror, thus $C_i = x \cdot (n_i^{before} \times n_i^{after})$,
   wherein $C_1 > 0$ applies to said first mirror,
   wherein $C_2 < 0$ applies to said second mirror,
   wherein $C_5 < 0$ applies to said fifth mirror, and
   wherein $C_6 > 0$ applies to said sixth mirror.

2. The projection objective according to claim 1, wherein said projection objective further comprises an exit pupil free of shading.

3. The projection objective according to claim 1, wherein said projection objective further comprises a diaphragm in said light path between said object plane and said image plane.

4. The projection objective according to claim 3, wherein said diaphragm is circular or substantially circular.

5. The projection objective according to claim 3, wherein said diaphragm is arranged in a vicinity of said first mirror or in a vicinity of said second mirror.

6. The projection objective according to claim 3, wherein said diaphragm is arranged on said first mirror or on said second mirror.

7. The projection objective according to claim 1, wherein said eight mirrors are arranged centered relative to an optical axis.

8. The projection objective according to claim 1, further comprising a numerical aperture is >0.2 on an image side.

9. The projection objective according to claim 8, wherein said numerical aperture is <0.5 on said image side.

10. The projection objective according to claim 1, wherein said projection objective forms an intermediate image of said object field in said light path between said object plane and said image plane.

11. The projection objective according to claim 1,
wherein said image field represents a segment of a ring field,
wherein said segment has an axis of symmetry and an extension perpendicular to said axis of symmetry, and
wherein said extension is at least 20 mm.

12. The projection objective according claim 11,
wherein said light bundle has a chief ray of a field point that lies on an axis of symmetry and in a center of said object field,
wherein said chief ray has an angle of incidence,
wherein said angle of incidence has a sine, and
wherein said sine of said angle of incidence is smaller at said object field than twice a value of a numerical aperture on an object side.

13. The projection objective according to claim 12, wherein said light bundle has a chief ray of a field point that lies on said axis of symmetry and in a center of said object field, and wherein said angle of incidence is <26° on said eight mirrors.

14. The projection objective according to claim 12, wherein said light bundle has a chief ray of a field point that lies on said axis of symmetry and in a center of said object field, and wherein said angle of incidence is <20° on said eight mirrors.

15. The projection objective according to claim 11, wherein said light bundle has a chief ray of a field point that lies on an axis of symmetry and in a center of said object field and wherein said chief ray has an angle of incidence is <45° on all said eight mirrors.

16. The projection objective device according to claim 1, wherein said projection objective is telecentric on an image side.

17. The projection objective according to claim 1, wherein said first mirror, said third mirror, and said fourth mirror are concave.

18. The projection objective according to claim 1, wherein said sixth mirror and said eighth mirror are concave.

19. The projection objective according to claim 1, wherein said second mirror is concave.

20. The projection objective according to claim 1, wherein said seventh mirror is convex and said eighth mirror is concave.

21. The projection objective according to claim 1, wherein
$C_3>0$ applies to said third mirror,
$C_4<0$ applies to said fourth mirror,
$C_7<0$ applies to said seventh mirror, and
$C_8>0$ applies to said eighth mirror.

22. The projection objective according to claims 1, wherein said chief ray reflected at said fourth mirror travels in a direction away from said optical axis.

23. The projection objective according to claim 1, wherein at least one of said eight mirrors has a radius of curvature having a value greater than a structural length of said projection objective.

24. The projection objective according to claim 1, wherein at least one of said second mirror, said third mirror and said fourth mirror has a radius of curvature having a value greater than a structural length of said projection objective.

25. The projection objective according to claim 1,
wherein said projection objective has a drift path that is formed between two of said eight mirrors, and
wherein said drift path is longer than 70% of a structural length of said projection objective.

26. The projection objective according to claim 1, wherein said projection objective is characterized by a sum of (a) the lengths of all drift paths between pairs of sequential mirrors in said light path, (b) the length from said object plane to a vertex of a first mirror in said light path, and (c) the length from a vertex of said eighth mirror to said image plane in said light path, as represented by the following formula:

sum=length of a drift path between said first mirror and said second mirror,+length of a drift path between said second mirror and said third mirror,+length of a drift path between said third mirror and said fourth mirror,+length of a drift path between said fourth mirror and said fifth mirror,+length of a drift path between said fifth mirror and said sixth mirror,+length of a drift path between said sixth mirror and said seventh mirror,+length of a drift path between said seventh mirror and said eighth mirror,+length from said object plane to a vertex of said first mirror,+length from vertex of said eighth mirror to said image plane, and wherein said sum is at least 2.5 times a structural length of the projection objective.

27. The projection objective according to claim 1, wherein said fifth mirror is concave.

28. The projection objective according to claim 1, wherein said sixth mirror is convex.

29. The projection objective according to claim 1, wherein in said light path between the object plane and the image plane is formed exactly one intermediate image.

30. The projection objective according to claim 1, wherein
$C_3<0$ applies to said third mirror,
$C_4>0$ applies to said fourth mirror,
$C_7>0$ applies to said seventh mirror, and
$C_8<0$ applies to said eighth mirror.

31. The projection objective according to claim 1,
wherein said projection objective comprises a first subsystem, a second subsystem and a third subsystem, and
wherein said first subsystem images said object field into a first intermediate image of said object field, wherein said second subsystem images said first intermediate image of said object field into a second intermediate image of said object field, and wherein said third subsystem images said second intermediate image of said object field into said image field.

32. The projection objective according to claim 31, wherein each of said first, second and third subsystem comprises at least two of said eight mirrors.

33. The projection objective according to claim 31, wherein said first subsystem comprises said first and second mirror, said second subsystem comprises said third, fourth, fifth and sixth mirrors and said third subsystem comprises said seventh and eighth mirror.

34. The projection objective according to claim 1, wherein said sixth mirror is concave.

35. The projection objective according to claim 1, wherein said fifth mirror is convex.

36. The projection objective according to claim 1, wherein one of said eight mirrors is spherical.

37. The projection objective according to claim 1,
wherein seven of said eight mirrors are aspheric and one of said eight mirrors is spherical, and
wherein said spherical mirror has an off-axis segment with a larger distance to an optical axis than said aspheric mirrors.

38. The projection objective according to claim 1, wherein said sixth mirror is spherical.

39. A projection exposure system comprising:
a projection objective of claim 1;
an illumination device, wherein said illumination device partially collects light and further conducts said light to illuminate a ring field;
a structure- or pattern-bearing mask on a support system,
wherein said pattern-bearing mask is arranged in a plane of said ring field, and
wherein said projection objective images an illuminated part of said pattern-bearing mask into said image field; and
a light-sensitive substrate on a support system, wherein said light-sensitive substrate is arranged in said image plane of said projection objective.

40. The projection exposure system according to claim 39, wherein said projection exposure system is used to process a chip.

41. The projection objective according to claim 1, wherein said image field represents a segment of a ring field, wherein said segment has an axis of symmetry and an extension perpendicular to said axis of symmetry, and wherein said extension is at least 25 mm.

42. The projection objective according to claim 1, wherein each of said eight mirrors comprises an off-axis segment, onto which said light bundle impinges, and wherein for each of said eight mirrors, a distance of said off-axis segment to an optical axis is at most 25% of a structural length of the projection objective.

43. A projection objective that provides a light path for a light bundle from an object field in an object plane to an image field in an image plane, said projection objective comprising:
a first mirror;
a second mirror;
a third mirror;
a fourth mirror;
a fifth mirror;
a sixth mirror;
a seventh mirror; and
an eighth mirror,
wherein said light path is provided via said eight mirrors and is free of obscuration,
wherein said light bundle includes light with a wavelength in a range of 10–30 nm,
wherein said projection objective has a drift path that is formed between two of said eight mirrors, and
wherein said drift path is longer than 70% of a structural length of said projection objective.

44. The projection objective according to claim 43, wherein said projection objective further comprises a diaphragm in said light path between said object plane and said image plane.

45. The projection objective according to claim 44, wherein said diaphragm is circular or substantially circular.

46. The projection objective according to claim 44, wherein said diaphragm is arranged in a vicinity of said first mirror or in a vicinity of said second mirror.

47. The projection objective according to claim 43,
wherein said object field represents a segment of a ring field with an axis of symmetry which is perpendicular to an optical axis,
wherein said light bundle has a chief ray of a field point that lies on an axis of symmetry and in a center of said object field,
wherein said projection objective has therein a right-handed coordinate system with an x axis, a y axis and a z axis,
wherein said z axis runs parallel to said optical axis and said z axis points from said object field to said image field,
wherein said y axis runs parallel to said axis of symmetry and said y axis points from said optical axis to said object field,
wherein for each of said eight mirrors i (i=1 to 8) there is a characteristic quantity $C_i$, which is defined as a scalar product of a unit vector x in a direction of said x axis and a vector product between one unit vector $n_i^{before}$, which has a direction of said chief ray striking an ith mirror, and a unit vector $n_i^{after}$, which has a direction of said chief ray reflected at said ith mirror, thus $C_i = x \cdot (n_i^{before} \times n_i^{after})$,
wherein $C_1 > 0$ applies to said first mirror,
wherein $C_2 < 0$ applies to said second mirror,
wherein $C_5 < 0$ applies to said fifth mirror, and
wherein $C_6 > 0$ applies to said sixth mirror.

48. The projection objective according to claim 47, wherein said chief ray reflected at said fourth mirror travels in a direction away from said optical axis.

49. The projection objective according to claim 43, wherein said eight mirrors are arranged centered relative to an optical axis.

50. The projection objective according to claim 43, further comprising a numerical aperture is >0.2 on an image side.

51. The projection objective according to claim 50, wherein said numerical aperture is <0.5 on said image side.

52. The projection objective according to claim 43, wherein said projection objective forms an intermediate image of said object field in said light path between said object plane and said image plane.

53. The projection objective according to claim 43,
wherein said image field represents a segment of a ring field,
wherein said segment has an axis of symmetry and an extension perpendicular to said axis of symmetry, and
wherein said extension is at least 20 mm.

54. The projection objective according claim 43,
wherein said light bundle has a chief ray of a field point that lies on an axis of symmetry and in a center of said object field,
wherein said chief ray has an angle of incidence,
wherein said angle of incidence has a sine, and
wherein said sine of said angle of incidence is smaller at said object field than twice a value of a numerical aperture on an object side.

55. The projection objective according to claim 43, wherein said light bundle has a chief ray of a field point that lies on an axis of symmetry and in a center of said object field and wherein said chief ray has an angle of incidence is <45° on all said eight mirrors.

56. The projection objective according to claim 43,
wherein each of said eight mirrors comprises an off-axis segment, onto which said light bundle impinges, and wherein said off-axis segment is at a distance from said optical axis, and
wherein said distance is at most 30%, of a structural length of said projection objective.

57. The projection objective device according to claim 43, wherein said projection objective is telecentric on an image side.

58. The projection objective according to claim 43, wherein said first mirror, said third mirror, and said fourth mirror are concave.

59. The projection objective according to claim 43, wherein said sixth mirror and said eighth mirror are concave.

60. The projection objective according to claim 43, wherein said second mirror is concave.

61. The projection objective according to claim 43, wherein said seventh mirror is convex and said eighth mirror is concave.

62. The projection objective according to claim 43, wherein for each of said eight mirrors i (i=1 to 8) there is a characteristic quantity $C_i$, which is defined as a scalar product of a unit vector x in a direction of said x axis and a vector product between one unit vector $n_i^{before}$, which has a direction of said chief ray striking an ith mirror, and a unit vector $n_i^{after}$, which has a direction of said chief ray reflected at said ith mirror, thus $C_i = x(n_i^{before} \times n_i^{after})$,
$C_3 > 0$ applies to said third mirror,
$C_4 < 0$ applies to said fourth mirror,
$C_7 < 0$ applies to said seventh mirror, and
$C_8 > 0$ applies to said eighth mirror.

63. The projection objective according to claim 43, wherein at least one of said eight mirrors has a radius of curvature having a value greater than a structural length of said projection objective.

64. The projection objective according to claim 43, wherein at least one of said second mirror, said third mirror and said fourth mirror has a radius of curvature having a value greater than a structural length of said projection objective.

65. The projection objective according to claim 43, wherein said projection objective is characterized by a sum of (a) the lengths of all drift paths between pairs of sequential mirrors in said light path, (b) the length from said object plane to a vertex of a first mirror in said light path, and (c) the length from a vertex of said eighth mirror to said image plane in said light path, as represented by the following formula:

sum=length of a drift path between said first mirror and said second mirror,+length of a drift path between said second mirror and said third mirror,+length of a drift path between said third mirror and said fourth mirror,+length of a drift path between said fourth mirror and said fifth mirror,+length of a drift path between said fifth mirror and said sixth mirror,+length of a drift path between said sixth mirror and said seventh mirror,+length of a drift path between said seventh mirror and said eighth mirror,+length from said object plane to a vertex of said first mirror,+length from vertex of said eighth mirror to said image plane, and wherein said sum is at least 2.5 times a structural length of the projection objective.

66. The projection objective according to claim 43, wherein said fifth mirror is concave.

67. The projection objective according to claim 43, wherein said sixth mirror is convex.

68. The projection objective according to claim 43, wherein in said light path between the object plane and the image plane is formed exactly one intermediate image.

69. The projection objective according to claim 43, wherein for each of said eight mirrors i (i=1 to 8) there is a characteristic quantity $C_i$, which is defined as a scalar product of a unit vector x in a direction of said x axis and a vector product between one unit vector $n_i^{before}$, which has a direction of said chief ray striking an ith mirror, and a unit vector $n_i^{after}$, which has a direction of said chief ray reflected at said ith mirror, thus $C_i = x(n_i^{before} \times n_i^{after})$,
$C_3 < 0$ applies to said third mirror,
$C_4 > 0$ applies to said fourth mirror,
$C_7 > 0$ applies to said seventh mirror, and
$C_8 < 0$ applies to said eighth mirror.

70. The projection objective according to claim 43,
wherein said projection objective comprises a first subsystem, a second subsystem and a third subsystem, and
wherein said first subsystem images said object field into a first intermediate image of said object field, wherein said second subsystem images said first intermediate image of said object field into a second intermediate image of said object field, and wherein said third subsystem images said second intermediate image of said object field into said image field.

71. The projection objective according to claim 70, wherein each of said first, second and third subsystem comprises at least two of said eight mirrors.

72. The projection objective according to claim 71, wherein said first subsystem comprises said first and second mirror, said second subsystem comprises said third, fourth, fifth and sixth mirrors and said third subsystem comprises said seventh and eighth mirror.

73. The projection objective according to claim 43, wherein said sixth mirror is concave.

74. The projection objective according to claim 43, wherein said fifth mirror is convex.

75. The projection objective according to claim 43, wherein one of said eight mirrors is spherical.

76. The projection objective according to claim 43,
wherein seven of said eight mirrors are aspheric and one of said eight mirrors is spherical, and
wherein said spherical mirror has an off-axis segment with a larger distance to an optical axis than said aspheric mirrors.

77. The projection objective according to claim 43, wherein said sixth mirror is spherical.

78. A projection exposure system comprising:
a projection objective of claim 43;
an illumination device, wherein said illumination device partially collects light and further conducts said light to illuminate a ring field;
a structure- or pattern-bearing mask on a support system, wherein said pattern-bearing mask is arranged in a plane of said ring field, and
wherein said projection objective images an illuminated part of said pattern-bearing mask into said image field; and
a light-sensitive substrate on a support system, wherein said light-sensitive substrate is arranged in said image plane of said projection objective.

79. The projection exposure system according to claim 78, wherein said projection exposure system is used to process a chip.

* * * * *

UNITED STATES PATENT AND TRADEMARK OFFICE
CERTIFICATE OF CORRECTION

| | |
|---|---|
| PATENT NO. | : 7,177,076 B2 |
| APPLICATION NO. | : 10/418515 |
| DATED | : February 13, 2007 |
| INVENTOR(S) | : Mann et al. |

It is certified that error appears in the above-identified patent and that said Letters Patent is hereby corrected as shown below:

In the drawings:
Figure 8, labeled Sheet 10 of 11, should correctly be "Table 2" not "Table 4."

Figure 9, labeled Sheet 11 of 11, should correctly be "Table 4" not "Table 2."

Signed and Sealed this

Fourteenth Day of April, 2009

JOHN DOLL
*Acting Director of the United States Patent and Trademark Office*

TABLE 2

| ELEMENT NUMBER | RADIUS | THICKNESS | DIAMETER | TYPE |
|---|---|---|---|---|
| OBJECT | INF | 437.1550 | | |
| S1 | A(1) | -248.1062 | 218.4102 | REFL |
| | | APERTURE DIAPHRAGM | 91.5283 | |
| | | 0.0000 | | |
| S2 | A(2) | 193.6511 | 91.5770 | REFL |
| S3 | A(3) | -230.6805 | 193.7182 | REFL |
| S4 | A(4) | 619.7098 | -320.2546 | REFL |
| S5 | A(5) | -169.8751 | 398.3988 | REFL |
| S6 | A(6) | 202.7900 | 280.0000 | REFL |
| S7 | A(7) | -293.6734 | 85.8365 | REFL |
| S8 | A(8) | 326.9836 | 308.4810 | REFL |
| IMAGE | INF | | 55.0127 | |

ASPHERIC CONSTANT $$Z = \frac{(CURV)Y^2}{1 + (1-(1+K)(CURV)^2 Y^2)^{1/2}} + (A)Y^4 + (B)Y^6 + (C)Y^8 + (D)Y^{10} + (E)Y^{12} + (F)Y^{14} + (G)Y^{16} + (H)Y^{18} + (J)Y^{20}$$

| ASPHERIC PROFILE | CURV | K / E | A / F | B / G | C / H | D / J |
|---|---|---|---|---|---|---|
| A(1) | -0.00123747 | 0.000000 | 2.31212E-09 | -1.20823E-14 | 5.14612E-19 | -3.39768E-23 |
| | | 2.27258E-27 | -4.42780E-32 | 0.00000E+00 | 0.00000E+00 | 0.00000E+00 |
| A(2) | 0.00016948 | 0.000000 | -1.89814E-08 | -2.29358E-13 | -4.85183E-19 | 1.15028E-20 |
| | | -4.21257E-24 | 5.69674E-28 | 0.00000E+00 | 0.00000E+00 | 0.00000E+00 |
| A(3) | -0.00011398 | 0.000000 | 6.83150E-09 | -7.67300E-14 | -1.83359E-18 | 5.15096E-23 |
| | | -6.74819E-28 | 2.38485E-32 | 0.00000E+00 | 0.00000E+00 | 0.00000E+00 |
| A(4) | 0.00052128 | 0.000000 | 1.30246E-09 | 2.58343E-15 | -1.56164E-19 | 2.66615E-24 |
| | | -3.14527E-29 | 7.08197E-34 | 0.00000E+00 | 0.00000E+00 | 0.00000E+00 |
| A(5) | -0.00182108 | 0.000000 | 1.19681E-09 | -5.86576E-16 | 1.80550E-19 | -1.61113E-24 |
| | | 6.43317E-30 | 9.29849E-36 | 0.00000E+00 | 0.00000E+00 | 0.00000E+00 |
| A(6) | -0.00107055 | 0.000000 | 2.53003E-08 | -1.45839E-12 | 7.48859E-17 | -1.88858E-21 |
| | | 1.34840E-28 | 6.67275E-31 | 0.00000E+00 | 0.00000E+00 | 0.00000E+00 |
| A(7) | 0.00584900 | 0.000000 | 5.51082E-08 | 9.28611E-13 | -4.97336E-16 | -6.35635E-20 |
| | | -9.50902E-24 | -1.70958E-26 | 0.00000E+00 | 0.00000E+00 | 0.00000E+00 |
| A(8) | 0.00289780 | 0.000000 | 4.07773E-10 | 3.17817E-15 | 2.23903E-20 | 1.62047E-25 |
| | | 1.06923E-30 | 3.39378E-35 | 0.00000E+00 | 0.00000E+00 | 0.00000E+00 |

Reference wavelength = 13.0 nm
Imaging scale = 0.25
Image-side aperture = 0.40

Fig.8

TABLE 4

| ELEMENT NUMBER | RADIUS | THICKNESS | DIAMETER | TYPE |
|---|---|---|---|---|
| OBJECT | INF | 846.0618 | | |
| | | APERTURE DIAPHRAGM | 174.4481 | |
| | | 0.0000 | | |
| S1 | A(1) | -596.9226 | 174.6201 | REFL |
| S2 | A(2) | 1258.0118 | 302.7847 | REFL |
| S3 | A(3) | -560.6789 | 376.8895 | REFL |
| S4 | A(4) | 502.0689 | 132.7627 | REFL |
| S5 | A(5) | -548.1913 | 251.5133 | REFL |
| S6 | 869.9668 CC | 1025.6939 | 825.4854 | REFL |
| S7 | A(6) | -318.8926 | 93.9960 | REFL |
| S8 | A(7) | 349.2051 | 327.8528 | REFL |
| IMAGE | INF | | 56.5275 | |

ASPHERIC CONSTANT $$Z = \frac{(CURV)Y^2}{1 + (1-(1+K)(CURV)^2 Y^2)^{1/2}} + (A)Y^4 + (B)Y^6 + (C)Y^8 + (D)Y^{10}$$

| ASPHERIC PROFILE | CURV | K | A | B | C | D |
|---|---|---|---|---|---|---|
| A(1) | -0.00077091 | 0.000000 | 1.74667E-09 | 3.88468E-14 | 2.31479E-19 | -1.93103E-23 |
| A(2) | 0.00069673 | 0.000000 | -3.24472E-10 | 2.27112E-15 | 7.69172E-21 | 7.04100E-26 |
| A(3) | -0.00095818 | 0.000000 | -8.63211E-11 | -3.33704E-16 | 3.53842E-21 | -2.98818E-26 |
| A(4) | 0.00013409 | 0.000000 | 5.05967E-09 | 1.60649E-13 | -2.50451E-18 | -6.77039E-22 |
| A(5) | 0.00174877 | 0.000000 | -1.31667E-09 | 7.91407E-15 | -1.05690E-19 | 2.09186E-24 |
| A(6) | 0.00451027 | 0.000000 | 7.10441E-08 | 3.63352E-12 | -1.83737E-17 | 1.18169E-20 |
| A(7) | 0.00267159 | 0.000000 | 2.02896E-10 | 2.44899E-15 | 2.34247E-20 | 2.04113E-25 |

Reference wavelength = 13.0 nm
Imaging scale = -0.25
Image-wide aperture = 0.40

Fig.9